United States Patent [19]

Thery et al.

[11] 4,382,154

[45] May 3, 1983

[54] DEVICE SENSITIVE TO A TEMPERATURE GRADIENT AND ITS APPLICATION FOR CONSTRUCTING A THERMAL FLUXMETER OR SOLAR SENSOR

[75] Inventors: Pierre Thery, Villeneuve d'Ascq; Guy Ravalitera; Michel Cornet, both of Bethune, all of France

[73] Assignee: Agence Nationale De Valorisation De La Recherche (ANVAR), France

[21] Appl. No.: 212,255

[22] Filed: Dec. 2, 1980

[30] Foreign Application Priority Data

Dec. 3, 1979 [FR] France ............................... 79 29699

[51] Int. Cl.³ ............................................ H01L 35/32
[52] U.S. Cl. .................................... 136/206; 136/225; 136/227; 136/241; 374/30
[58] Field of Search ............. 73/190 H; 136/206, 225, 136/227, 239, 241

[56] References Cited

U.S. PATENT DOCUMENTS

| 2,378,804 | 6/1945 | Sparrow et al. | 136/225 |
| 4,111,717 | 9/1978 | Baxter | 136/225 |
| 4,197,738 | 4/1980 | Degenne | 136/225 |
| 4,276,441 | 6/1981 | Wilson | 136/227 |

FOREIGN PATENT DOCUMENTS 794973  5/1958  United Kingdom ................. 136/225

OTHER PUBLICATIONS

Jakob, Heat Transfer, vol. II, John Wiley & Sons, Inc., New York, 1957, pp. 192 to 197, 622 and 623.

*Primary Examiner*—Leland A. Sebastian
*Attorney, Agent, or Firm*—Ostrolenk, Faber, Gerb & Soffen

[57] ABSTRACT

The invention relates to a device sensitive to a temperature gradient or to a heat flow comprising at least one elementary cell formed by a thin layer made from a first electric conductor or semiconductor, such as constantan, coated with a very thin electrolytic layer of a second electric conductor or semiconductor, such as copper.

It has been discovered that induced electric currents flow through the surface separating the conductors, the electric voltages observed in each of the conducting or semiconducting layers being proportional to the instantaneous spatial mean of the surface thermal gradient.

The invention also relates to the application of such cells for measuring temperature gradients and heat flows and for converting heat energy into electric energy.

13 Claims, 7 Drawing Figures

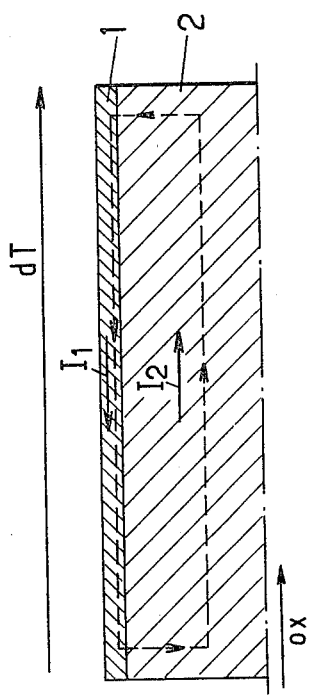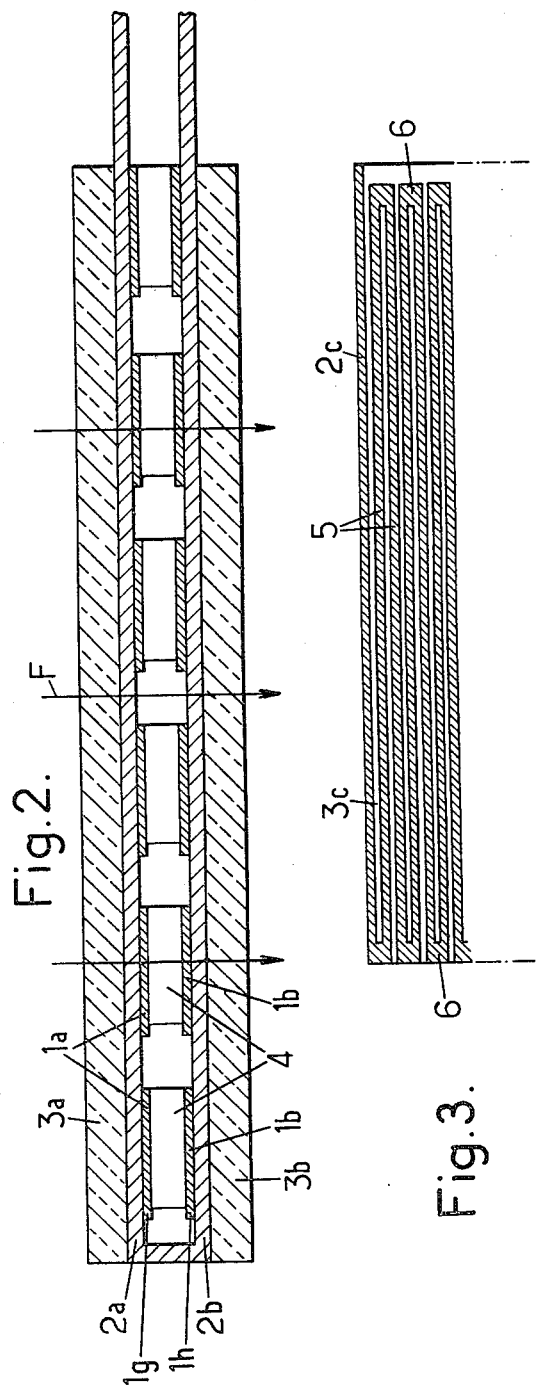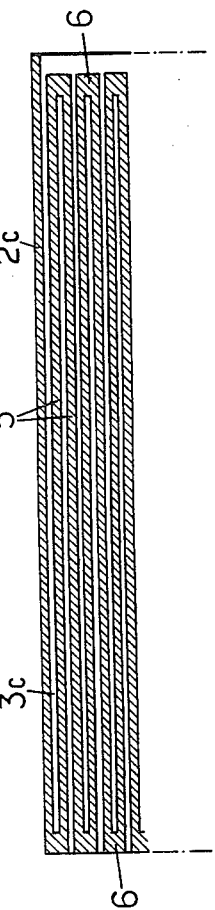
Fig.1.
Fig.2.
Fig.3.

DEVICE SENSITIVE TO A TEMPERATURE GRADIENT AND ITS APPLICATION FOR CONSTRUCTING A THERMAL FLUXMETER OR SOLAR SENSOR

BACKGROUND OF THE INVENTION

The invention relates to a device, of the thermocouple type, responsive to a temperature gradient, i.e. a thermal fluxmeter or a thermal sensor.

Thermo-electric couples are known responsive to a temperature gradient, usable as heat flux detectors, of fluxmeters, comprising an assembly of thin plates of constantan, copper and chromel.

Such fluxmeters are described for example in the U.S. Pat. Nos. 3,607,445 and 3,767,470 in the name of Frank F. Hines.

Fluxmeters are moreover known comprising a thin elongated plate of a plastic material around which is wound a wire of constantan one part of which is silvered or coppered, the silvered or coppered parts forming conceivably thermocouples, whereas the noncoated parts form connections which connect the thermocouples in series (see book by Max Jakob Heat Transfer, ed. John Wiley New York and Chapmann & Hall London 1957, vol. II, p. 195 and 196) where a device invented by L. M. K. Boelter is described with reference to FIG. 33-23, as well as a nondated TPD brochure from Technisch Physische Dienst of Delft, Netherlands.

SUMMARY OF THE INVENTION

The applicants have just discovered that it is possible to construct fluxmeters by coating a thin layer of constantan with an electrolytic copper deposit, more generally by coating a thin layer of a conductor (or of a semiconductor) of electricity with an electrolytic deposit of another conductor (or semiconductor) of electricity, these two conductors (or semiconductors) having different thermo-electric forces. Thus, in place of the constantan-copper couple, a semiconductor-copper couple may be used (the copper being deposited electrolytically on the semiconductor) and in both cases the copper can be replaced by silver.

The applicant has in fact discovered that, when a conducting or semiconducting layer is coated with a conducting or semiconducting electrolytic deposit of a different material, induced electric currents flow through the surface which separates the two superimposed conductors or semiconductors, the flow of these currents causing, in each of the conductors or semiconductors, resistive drops which are proportional to the spatial mean value of the surface thermal gradient.

This property of electrolytic deposits on a conducting or semiconducting layer is used, within the scope of the invention, to construct a flux-meter adapted to measuring a heat flow or to controlling regulation means, or else a sensor adapted to generate electric energy in response to a heat flow.

To construct these sensitive detection devices or sensors adapted to deliver a not inconsiderable electric power, a battery of elementary cells is grouped together, each of which is formed by a thin layer of a first conducting or semiconducting material coated with an electrolytic deposit of a second conducting or semiconducting material.

Contrary to prior practice consisting in constructing devices of the thermal fluxmeter type which comprise an auxiliary insulating wall, on each side of which conventional thermocouples are disposed formed for example, as previously indicated, by thin plates of constantan, copper and chromel, the invention consists in constructing a device responsive to a temperature gradient, applicable for measuring a heat flow or for transforming such a flow into an available electric current, characterized by the fact that it comprises at least one sensitive thermoelectric cell comprising essentially a thin layer of a first conducting or semiconducting material, coated with a very thin electrolytic deposit of a second conducting or semiconducting material, the thermo-electric properties of the first and of the second material being different.

As will be discussed in more detail hereafter, when a single cell formed by a thin layer of a first conducting or semiconducting material coated with an electrolytic deposit of a second conducting or semiconducting material is used, a thermal gradient parallel to the contact surface between the two materials generates an electric current flowing through the cell. To measure a thermal gradient perpendicular to this surface, i.e. a heat flow passing through this surface, it is necessary to provide a certain relative dissymmetry between the geometry of the thin layer and that of the electrlytic deposit, the facing surfaces of the deposit and of the layer do not completely coincide so as to create a heat gradient parallel to the contact surface between the two materials and so to come back to the preceding case.

Preferably the first material is an alloy called constantan (conductor) or else a semiconductor, whereas the second material is copper or silver (conductor).

Advantageously the device of the invention comprises numerous cells of the above-mentioned type small in size and connected together in series and/or in parallel.

Thus a fluxmeter may be constructed comprising at least one thousand or so elementary cells disposed on a substrate.

A heat sensor may also be constructed or converter of heat energy into electric energy comprising several thousand cells formed in particular by two rows of pieces of coppered or silvered constantan, these two rows being separated by alternate layers of copper or silver and constantan, the whole generating an electric current when the two said rows have passing therethrough in series a heat flow.

DESCRIPTION OF THE DRAWINGS

The invention will in any case be well understood with the help of the complement of description which follows, as well as the accompanying drawings, which complement and drawings are of course given especially by way of indication.

FIG. 1 illustrates in section an elementary cell comprising the improvements of the invention and responsive to a temperature gradient or heat flow.

FIG. 2 represents, also in section, a fluxmeter comprising several elementary cells as illustrated in FIG. 1.

FIGS. 3 to 5 show in a top view two particular embodiments of a fluxmeter in accordance with the invention, FIGS. 4 and 5 illustrating on a larger scale portions of FIG. 3 in the case of the two embodiments.

DESCRIPTION OF THE PREFERRED EMBODIMENTS

Figure 4:
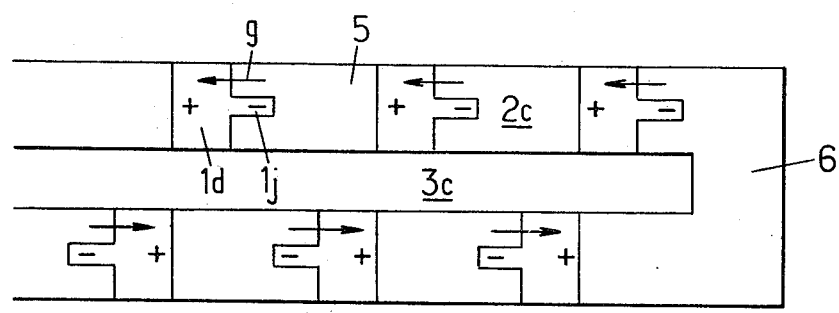

In accordance with the invention, and more especially in accordance with that of its modes of application, as well as those of the embodiments of its different parts, to which it seems preference should be given, desiring for example to construct a device responsive to a temperature gradient or heat flow, the following or similar is the way to set about it.

Reference is made first of all to FIG. 1 in which there is illustrated schematically an elementary cell applying the principle of the invention, i.e. the construction of an element responsive to a heat flow formed by a thin layer of a first conductor or semiconductor, coated with a very thin electrolytic deposit of a second conductor or semiconductor.

In FIG. 1, there is shown at 2 said thin layer, formed for example from a copper and nickel alloy called constantan, and at 1 the very thin electrolytic deposit formed for example from copper.

In the presence of a tangential temperature gradient dT, there are formed induced electric currents $I_1$ (in the copper deposit 1) and $I_2$ (in constantan layer 2) having different directions. Thus there are formed currents flowing through the separation surface between the two conductors (or semiconductors) 1 and 2 (circuit of the electric currents shown with a broken line). The intensity of the electric currents thus produced by gradient dT is proportional to dT, which allows the measurement of a thermal gradient or heat flow to be measured with the sensitive element of FIG. 1; it is in fact sufficient to determine the intensity of the currents induced by this gradient in the element of FIG. 1.

Several cells (for example one thousand cells or so) in accordance with FIG. 1 may be disposed on a substrate and connected in series and/or in parallel.

The theoretic and experimental study of the thermoelectric effect in systems formed by a conducting layer coated with an electrolytic deposit has revealed particularly interesting properties. Under the action of a surface thermal gradient, there appears, in each of the superimposed conducting layers, induced currents flowing through the separation surface of the superimposed conductors. The intensity of these currents is proportional to the instantaneous value of the spatial mean value of the surface thermal gradient. The resistive drops caused by the passage of these currents are data representative of the surface heat exchanges. It is the use of this data which has enabled a new solution to be provided for the problems of the measurement of surface temperatures and of the conversion of heat energy into electric energy.

(a) Experimental Results

The devices studied have been constructed by depositing electrolytically a layer of copper substantially one micron thick on a sheet of constantan substantially twenty-five microns thick. When the surface of the system shown schematically in FIG. 1 is subjected to a tangential thermal gradient in the direction ox, each of the superimposed conductors 1 and 2 is subjected to an electric voltage $V_1$ and $V_2$ respectively. These electric voltages $V_1$ and $V_2$ are measured by connecting a microvoltmeter in circuits formed with copper and constantan wires respectively so as to eliminate the conventional electromotive forces of thermo-electric origins. The value of voltages $V_1$ and $V_2$ does not depend solely on the temperature difference between the ends of the electrolytic deposit, but on the symmetry of the range of surface temperature with respect to the plane passing through the middle of the system. When the surface temperature distribution is symmetrical: $T(x)=T(-x)$, the voltages observed are identically zero: $V_1=V_2=0$. On the other hand, when $T(x)\neq T(-x)$, the voltages $V_1$ and $V_2$ have nonzero values. The amplitude of these voltages depends on the degree of symmetry of the imposed range of surface temperatures. This particular thermo-electric effect has been characterized by applying a uniform antisymmetric distribution defined by the relationship $$T(x) = T_o + \Delta T(x) \qquad T(-x) = T_o - \Delta T(x) \text{ with}$$

$$\frac{\partial T}{\partial x} = \frac{T_1 - T_2}{\rho} \text{ if } -\frac{\rho}{2} < x < \frac{\rho}{2}$$

The amplitude of the thermal gradient imposed is determined by the temperature difference $T_2-T_1$ applied between the ends of the electrolytic deposit. Experimental results have shown that $V_1$ and $V_2$ are proportional to the temperature gradient. Voltages $V_1$ and $V_2$ were compared with voltages $V_1'$ and $V_2'$ which appear in a similar noncoppered device (usual thermocouple).

These voltages are tied together by the relationship $$V_1 - V_2 = V_1' \quad V_2' = 0 \tag{1}$$

whatever the value of $T_2-T_1$.

The ratio of $V_1/V_2$ depends on the ratio of the thicknesses of the copper and constantan deposits.

The observation $V_2'=0$ conforms to the well-known law according to which a voltage created by thermoelectric effect cannot appear in an homogeneous conductor subjected to a temperature difference. When the constantan is coppered, there appears in the constantan circuit a voltage $V_2$ proportional to the difference of temperature between the ends of the coppered region. Relationship (1) has been confirmed whatever the thickness of the coppering and will be used to justify the following theoretical interpretation.

The proportionality relationship between $V_1$ and $V_2$ and the temperature difference applied is only confirmed if the surface thermal gradient applied is uniform. The study of voltages $V_1$ and $V_2$ induced when the temperature profile is not uniform has shown that the electric data $V_1$ and $V_2$ were proportional to the instantaneous spatial mean of the tangential thermal gradient.

When the constantan is not entirely coppered, the induced voltages are proportional to the instantaneous spatial mean of the thermal gradient in the coppered regions.

(b) Interpretation of the Surface Thermo-Electric Effect The phenomenological equations for representing the thermo-electric coupling in an homogeneous conductor are well-known (Landau).

They are applied in each of the superimposed conductors forming the system studied. The current densities $J_1$ and $J_2$ induced along ox, in each of the conductors marked 1 and 2, by a surface thermal gradient $\partial T/\partial x$ applied along direction ox and shown by the tangential component $\partial T/\partial x$ are of the form $$\begin{cases} j_1 = \sigma_1 E_1 - \alpha_1 \sigma_1 \frac{\partial T}{\partial x} \\ j_2 = \sigma_2 E_2 - \alpha_2 \sigma_2 \frac{\partial T}{\partial x} \end{cases}$$

$\sigma_1$ and $\sigma_2$ designating the surface conductivities of conductors 1 and 2 and $\alpha_1$ and $\alpha_2$ being coefficients relative to these conductors 1 and 2.

Since the thickness of conductors 1 and 2 is small with respect to their lateral dimensions, the temperature variations in the thickness direction may be disregarded and the study may be limited to the tangential thermoelectric coupling in the direction ox. The electric currents $I_1$ and $I_2$ induced by unit of length in the direction perpendicular to ox are:

$$I_1 = e_1 j_1 \qquad I_2 = e_2 j_2$$

$$I_1 = \sigma_1 e_1 E_1 - \alpha_1 \sigma_1 e_1 \frac{\partial T}{\partial x} \qquad (2)$$

$$I_2 = \sigma_2 e_2 E_2 - \alpha_1 \sigma_2 e_2 \frac{\partial T}{\partial x}$$

In an open circuit, currents $I_1$ and $I_2$ are tied together by the relationship $I_1 + I_2 = 0$.

On the other hand, on the surface separating conductors 1 and 2, there is conservation of the tangential component of the electric field: $E_1 = E_2 = E$.

Since the electromotive fields of thermo-electric origin $$\alpha_1 \frac{\partial T}{\partial x} \text{ and } \alpha_2 \frac{\partial T}{\partial x}$$

have different values, conservation of the tangential component of the electric field can only be achieved if currents $I_1$ and $I_2$ have values different from zero. The application of limit conditions allows the values of the electric field and of currents $I_1$ and $I_2$ to be calculated at each point of the system:

$$E = \frac{(\alpha_1 \sigma_1 e_1 + \alpha_2 \sigma_2 e_2)}{\sigma_1 e_1 + \sigma_2 e_2} \left( \frac{\partial T}{\partial x} \right) \qquad (3)$$

$$I_1 = -I_2 = \frac{(\alpha_2 - \alpha_1) \sigma_1 \sigma_2 e_1 e_2}{(\sigma_1 e_1 + \sigma_2 e_2)} \left( \frac{\partial T}{\partial x} \right)$$

The thermo-electric coupling is materialized by distribution of electric currents located at the places where the tangential thermal gradient has a nonzero value. These currents induced by the inequality of the thermoelectric fields in conducting media are closed again through the separation surface (FIG. 1). The values of $I_1$ and $I_2$ are such that the resistive drops induced by the passage of these currents in the conductors counterbalance the electric imbalance due to the inequality of the thermo-electric fields. It is in fact easy to verify that:

$$\alpha_1 \frac{\partial T}{\partial x} + \frac{I_1}{\sigma_1 e_1} = \alpha_2 \frac{\partial T}{\partial x} + \frac{I_2}{\sigma_2 e_2}$$

The passage of these currents causes resistive drops in the superimposed conductors. The elementary voltages $dV_1$ and $dV_2$ induced in a section of length dx in each of the conductors have for value:

$$dV_1 = \frac{I_1}{\sigma_1 e_1} dx = I_1 dR_1 = \frac{(\alpha_2 - \alpha_1)\sigma_2 e_2}{\sigma_1 e_1 + 2 e_2} \left( \frac{\partial T}{\partial x} \right) \qquad (4)$$

$$dV_2 \frac{I_2 dx}{\sigma_2 e_2} = I_2 dR_2 = \frac{(\alpha_1 - \alpha_2)\sigma_1 e_1}{(\sigma_1 e_1 + \sigma_2 e_2)} \left( \frac{\partial T}{\partial x} \right)$$

$dR_1$ and $dR_2$ being the resistance of the slice of length dx in conductors 1 and 2.

These elementary voltages are opposite in sign and unequal in amplitude. Their arithmetical sum confirms locally the relationship:

$$dV_1 - dV_2 = (\alpha_2 - \alpha_1) \frac{\partial T}{\partial x} dx$$

To interpret the experimental results, the overall value of voltages $V_1$ and $V_2$ must be calculated. These voltages, representing resisitve drops, are ties to the spatial mean values of currents $I_1$ and $I_2$. Since the sum of the currents induced at each point of the device are identically zero, since $I_1 = -I_2$, the same can be said for the overall current in the whole system.

On the other hand, the spatial mean values $\overline{I_1}$ and $\overline{I_2}$ are different from zero; they are tied to the spatial mean value of the thermal gradient by the relationship:

$$\overline{I_1} = -\overline{I_2} = \frac{(\alpha_2 - \alpha_1)\sigma_1 \sigma_2 e_1 e_2}{(\sigma_1 e_1 + \sigma_2 e_2)} \left( \overline{\frac{\partial T}{\partial x}} \right)$$

With these currents of nonzero average values are associated resistive drops tied to the spatial mean value of the thermal gradient by the relationships:

$$\overline{V_1} = R_1 \overline{I_1} = \frac{(\alpha_2 - \alpha_1)\sigma_2 e_2 \cdot \rho}{(1 e_1 + 2 e_2)} \left( \overline{\frac{\partial T}{\partial x}} \right) \qquad (5)$$

$$\overline{V_2} = R_2 \overline{I_2} = \frac{(\alpha_2 - \alpha_2)\sigma_1 e_1 \rho}{(1 e_1 + 2 e_2)} \cdot \left( \overline{\frac{\partial T}{\partial x}} \right)$$

1 being the length of the region covered by the electrolytic deposit. Voltages $\overline{V_1}$ and $\overline{V_2}$ induced in the conductors are unequal in value; they depend on the instantaneous mean value of the tangential thermal gradient and not on the instantaneous value of the difference of temperature between the thermo-electric contacts.

In the most general case where the direction along which the electric voltages are measured is not parallel to the direction along which the thermal stress is applied, the preceding expressions are still valid on condition that $(\partial T/\partial x)$ is replaced by $\overline{\partial T/\partial x} \cos \phi$, $\phi$ being the angle between the two directions.

The thermo-electric effect induced in a conductor coated with an electrolytic deposit is different from the thermo-electric effect usually used. In particular, there may be production of an electric voltage in a layer, whose ends are isothermal, subjected to a spatially dissymmetric thermal force.

The voltages observed experimentally may be identified with resistive drops $\overline{V}_1$ and $\overline{V}_2$ since the electromotive forces of thermo-electric origin are not observable in a closed homogeneous conductor. When the temperature distribution is symmetrical:

$$\frac{\partial T}{\partial x}(x) = -\frac{\partial T}{\partial x}(-x) \text{ resulting in } \overline{\frac{\partial T}{\partial x}} = 0$$

and $$\overline{V}_1 = \overline{V}_2 = 0$$

This result corresponds to the experimental observations.

When the system is subjected to dissymmetric temperature distribution characterized by a uniform value of the thermal gradient $$\left(\frac{\partial T}{\partial x}\right) = \frac{(T_2 - T_1)}{\rho}$$

the induced voltages are defined by the relationships:

$$\overline{V}_1 = \frac{(\alpha_2 - \alpha_1)\sigma_2 e_2}{(\sigma_1 e_1 + \sigma_2 e_2)}(T_2 - T_1) \quad (6)$$

$$\overline{V}_2 = \frac{(\alpha_1 - \alpha_2)\sigma_1 e_1}{(\sigma_1 e_1 + \sigma_2 e_2)}(T_2 - T_1)$$

These voltages are different in value and have for arithmetic sum:

$$V_1 - V_2 = (\alpha_2 - \alpha_1)(T_2 - T_1)$$

This relationship has been confirmed experimentally and justifies the above interpretation. In this particular case, the algebraic sum $V_1 - V_2$ is proportional to the temperature difference $T_2 - T_1$ at the terminals of the metalization. The coefficient of proportionality is that of a conventional thermocouple. The individual values of voltages $\overline{V}_1$ and $\overline{V}_2$ induced in the conductors depend on the relative values of the quantities $\sigma_1 e_1$ and $\sigma_2 e_2$. When the voltage is measured in the metallized conductor (marked 1), it is desirable to have the condition $\sigma_2 e_2 > \sigma_1 e_1$ so as to obtain a sensitivity close to that of a conventional thermocouple.

(c) Thermal Conductivity Coefficient of the System

To characterize totally this particular thermo-electric effect, voltages $\overline{V}_1$ and $\overline{V}_2$ must be related to the heat flows $\phi_1$ and $\phi_2$ located in each of the superimposed conductors. The general expression for the heat flow density in an homogeneous conductor through which flows a current of density j and which is subjected to a thermal gradient $\partial T/\partial x$ is of the form $$\phi = \alpha T j - \lambda \frac{\partial T}{\partial x} \quad (7)$$

Knowing the expressions (3) defining the electric currents in each of the conductors, relationship (7) allows the flows $\phi_1$ and $\phi_2$ in each of the conductors to be calculated.

$$\phi_1 = \left[ -\lambda_1 e_1 + \frac{\alpha_1(\alpha_2 - \alpha_1)\sigma_1\sigma_2 e_1 e_2 T}{(\sigma_1 e_1 + \sigma_2 e_2)} \right] \frac{\partial T}{\partial x} \quad (8\text{-}1)$$

$$\phi_2 = \left[ -\lambda_2 e_2 + \frac{\alpha_2(\alpha_1 - \alpha_2)\sigma_1\sigma_2 e_1 e_2 T}{(\sigma_1 e_1 + \sigma_2 e_2)} \right] \frac{\partial T}{\partial x} \quad (8\text{-}2)$$

$$\phi = \phi_1 + \phi_2 = -\left[ \lambda_1 e_1 + \lambda_2 e_2 + \frac{(\alpha_1 - \alpha_2)^2 \sigma_1\sigma_2 e_1 e_2 T}{(\sigma_1 e_1 + \sigma_2 e_2)} \right] \frac{\partial T}{\partial x} \quad (8\text{-}3)$$

The coefficients of proportionality between flow and thermal gradient depend on the thermo-electric coefficients of the superimposed conductors. There is modification of the thermal conductivities by thermo-electric coupling. The thermal resistance of the system $$\lambda' = \lambda_1 e_1 + \lambda_2 e_2 + \frac{(\alpha_1 - \alpha_2)^2 \sigma_1 \sigma_2 e_1 e_2}{\sigma_1 e_1 + \sigma_2 e_2} \quad (9)$$

is increased by thermo-electric coupling. This increase in conductivity is due to the production of a flow of electric energy which increases the efficiency of the energy exchanges. When the variations of the surface temperature are small with respect to the value of the absolute temperature, the heat flow $\phi$ is proportional to the temperature gradient $\partial T/\partial x$. Voltages $V_1$ and $V_2$ are then proportional to the spatial mean value of the heat flow.

Instead of being disposed tangentially with respect to the thermal gradient as illustrated in FIG. 1, a sensitive element, or elementary cell, in accordance with the invention may be disposed perpendicularly to the flow. Since the flow and the thermal gradient are perpendicular to the surface of the thermo-element, it is necessary to cause by construction a dissymmetry in the heat flow so as to induce a thermal gradient on the sensitive surface of the thermo-element.

In FIG. 2, there is shown an assembly of such elements or cells connected in series so as to increase the sensitivity of the fluxmeter.

In this figure, there is shown at 3a and 3b two plates made for example from a transparent epoxy resin, the heat flow passing through these two plates in the direction of arrows F.

Between these two plates 3a and 3b are disposed two plates 2a and 2b, made from constantan, coated on portions of their length with electrolytic copper deposits, respectively 1a and 1b; finally, heat-conducting pieces 4 connect together deposits 1a, 1b while ensuring thermal contact between each pair of electrolytic coatings 1a, 1b disposed facing each other.

It will be noted that pieces 4 are shorter (in the direction perpendicular to that of arrows F) than the electrolytic deposits 1a and 1b, these deposits extending at 1g and 1h beyond pieces 4.

Electrolytic deposits 1a, on the one hand, and 1b, on the other hand, are connected in series and thus there is obtained, by connecting together also in series the assembly of deposits 1a and the assembly of deposits 1b, an electric current proportional to the heat flow passing through the device of FIG. 2 in the direction of arrows F, because of the extension by portions 1g and 1h of layers 1a and 1b (dissymmetry).

Figure 5:
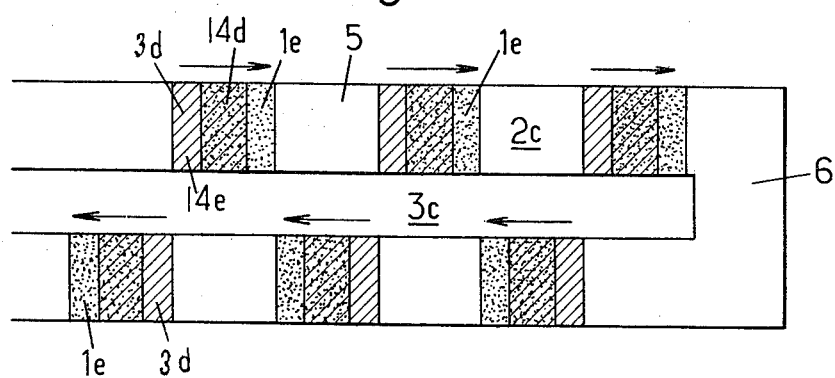

In FIGS. 3 to 5, there are shown two embodiments of a compact unit device sensitive to a heat flow. This device is formed (FIG. 3) by a plate 3c made from a plastic material, on which is deposited a thin meandering layer 2c of constantan. This layer 2c comprises a succession of narrow rectilinear deposits 5 connected in series at their ends by bridges 6 also made from the constantan alloy. On this layer 2c are formed silver or copper electrolytic deposits. Two forms of possible deposits ensuring dissymmetry are illustrated in FIGS. 4 and 5 on a larger scale than in FIG. 3 and on which we find gain a portion of plate 3c and of the meandering layer 2c.

In FIGS. 4 and 5, there are illustrated two different geometrical forms of electrolytic deposits.

In the case of FIG. 4, the electrolytic deposits 1d have a dissymmetrical form with a tail 1j. There is shown in FIG. 4 the polarities (+ and −) and the direction (arrows g) of the surface current.

In a modification, it is the constantan layer which could have a dissymmetrical form, the layer being discontinuous along the meandering surface, but comprising a series of interruptions according to a nonrectangular geometric form; in this case, the electrolytic deposit is formed by a series of successive zones each covering partly such a deposit and partly an interruption.

In the case of the embodiment of FIG. 5, the electrolytic deposits 1e (grained areas) are rectangular (or square) in shape and resin coatings 3d (hatched areas) are formed so as to each overlap a portion of an electrolytic deposit 1e (in the zone 14d) and an adjacent portion of the thin constantan layer 2c not coated with an electrolytic deposit (in zone 14e).

Figure 6:
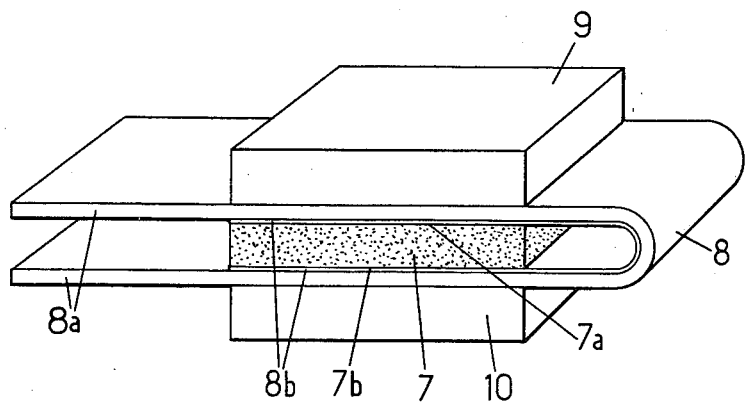
FIG. 6 illustrates in section the application of the invention to the measurement of a surface temperature.

FIG. 6 shows one way of achieving surface temperature measurement by use of the invention.

In this figure, there is shown at 7 a sample whose upper 7a and lower 7b surfaces may be at different temperatures. To determine the difference between temperature Ta of surface 7a and temperature Tb of surface 7b, a flexible device 8 in accordance with the invention is used comprising a succession of articulated constantan plates 8a coated with an electrolytic copper deposit 8b, the facing surfaces of the deposit and of the plates not coinciding so as to achieve dissymmetry; this device is folded as shown in FIG. 6 so that the copper deposit is in contact with surfaces 7a and 7b. If the temperatures of surfaces 7a and 7b are different, there is a temperature gradient in the copper deposit 8b and also in the assembly of the constantan plates 8a, resulting in the production of electric currents induced in the copper deposit 8b and the constantan plates 8a. These currents are proportional to the difference Ta−Tb and so to the heat flow passing through sample 7. In fact, the electric data $\overline{V}_1$ and $\overline{V}_2$ are, according to the explanations given above, proportional to the mean value of the surface thermal gradient and only cancel out if the surface temperature is uniform (relationship (5)). The heat flow may for example be produced by two heat exchangers 9 and 10.

There has been described up to now application of the invention in the construction of fluxmeters adapted to determining the intensity of a heat flow or apparatus for measuring a temperature gradient.

Figure 7:
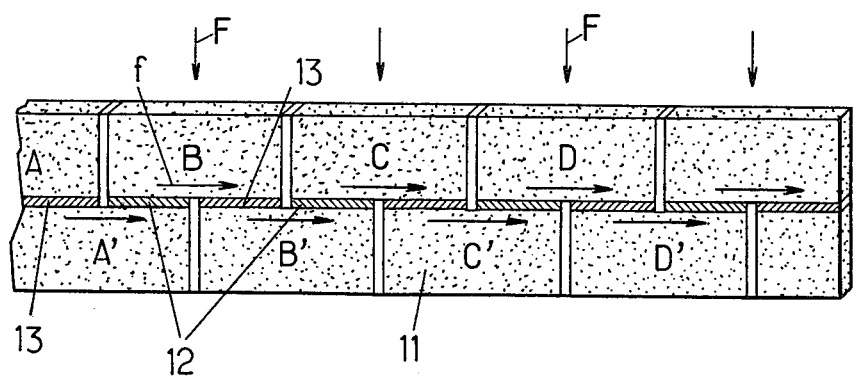
FIG. 7 represents, also in section, a sensor converting, by use of the invention, heat energy into electric energy.

The invention can also be applied for constructing converters of heat energy into electric energy. One embodiment of such a converter is illustrted in FIG. 7.

It comprises a great number of flux-measuring cells comprising coppered constantan elements 11 with separation layers made from constantan (layer 12) and copper (layer 13). The circuit is formed by the series of elements A A' B B' C C' D D' ..., i.e. copper, coppered constantan, constantan, copper, coppered constantan, constantan. The elements 11 in the same row are not in electrical contact.

A plate may thus be formed made up of 500,000 elements or elementary cells by bonding together one against the other coppered constantan plates coated with constantan and copper having a thickness of 25 microns and a width of 3 cm for example, so as to form a compact unit of 15×15×3 (in cm).

The heat to be converted into electricity arrives in the direction F and induces voltages represented by the arrows f.

Such devices may be used as construction material for building walls supplying electric energy when heat passes therethrough either from the outside to the inside (summer), or from the inside to the outside (winter when the inside is heated).

It can be seen that the invention allows a device to be constructed sensitive to a temperature gradient or to a heat flow, usable as a thermal fluxmeter, an apparatus for measuring temperature differences or a converter of heat energy into electric energy.

It is distinguished from the conventional constantan/copper thermocouples by the fact that it comprises a very thin electrolytic copper deposit on a thin layer of constantan, which allows very compact powerful devices to be constructed.

In short, the invention relates to a device sensitive to a temperature gradient or to a heat flow comprising at least one elementary cell formed by a thin layer of a first electric conductor or semiconductor, such as constantan, coated with a very thin electrolytic deposit of a second electric conductor or semiconductor such as copper or silver.

It has been discovered that induced electric currents flow through the surface separating the conductors, the electric voltages observed in each of the conducting or semiconducting layers being proportional to the instantaneous spatial mean value of the surface thermal gradient.

The invention also has as its object the application of such cells for measuring temperature gradients and heat flows and for the conversion of heat energy into electric energy.

A device in accordance with the invention allows regulation to be achieved (by delivering a control signal to a means regulating the heating) by counting the calories passing through a certain surface.

It also allows the heat loss coefficient of a wall, particularly an outside wall, to be determined.

It also allows measurement of the heat exchanges between living beings and their environment, being then constructed in the form of a fluxmeter plate fixable on the skin of a living being for example by means of a film which is selfadhesive on both its faces.

In the embodiments given by way of example, reference has been constantly made to electrolytic deposits of copper or silver on constantan, but the invention also applies to other very thin electrolytic deposits of electric conductors or semiconductors on thin layers of electric conductors or semiconductors of a different type, for example to the electrolytic deposits of copper or of another conducting metal (such as silver) on a semiconductor.

As is evident and as it follows moreover already from what has gone before, the invention is in no wise limited to those of its modes of application and embodiments which have been more specially considered; it embraces, on the contrary, all variations thereof.

We claim:

1. A device sensitive to heat flow or to a temperature gradient with at least one thermoelectric cell comprising essentially at least one continuous thin layer of a first conducting material having a face thereof coated with a thinner electrolytic deposit of a second conducting material different from said first conducting material and having thermoelectric properties differing from the thermoelectric properties of said first conducting material, and at least one pair of layers of an insulating material disposed on opposite faces of at least one thin layer and said deposit, the heat flow or temperature gradient being applied across a first one of said pair of layers, said at least one thin layer, said deposit and the second one of said pair of layers when said device is in operation, and at least one part comprising at least one thin layer, said deposit or said pair of layers having a dissymetric shape or being displaced relative to another of said parts.

2. The device as claimed in claim 1, wherein the facing surfaces of the electrolytic deposit and of the thin layer do not coincide completely so as to provide dissymmetry.

3. The device as claimed in claim 1, wherein the electrolytic deposit has a dissymmetric form.

4. The device as claimed in claim 1, wherein the thin layer has a dissymmetric form.

5. The device as claimed in claim 1, wherein the first material is the alloy called constantan, whereas the second material is copper or silver.

6. The device as claimed in claim 1, comprising numerous cells of the above-mentioned type small in size and electrically connected together.

7. The device as claimed in claim 6, wherein the thin layer is meandering in form, the electrolytic deposit is formed by a series of successive zones and said pair of layers is constituted by a succession of resin coatings, each of which covers partly a zoned and partly directly said layer.

8. The device as claimed in claim 6, wherein the thin layer is meandering in shape and the electrolytic deposit is formed by a succession of successive zones having a dissymmetric shape.

9. The device as claimed in claim 6, wherein the thin layer is meandering in shape with interruptions dissymetrical in shape, the electrolytic deposit being formed by a succession of successive zones each covering partly a deposit and partly an interruption.

10. A thermal fluxmeter or thermal gradientmeter constituted by a device as claimed in claim 1, comprising at least about 1,000 of said cells.

11. An energy converter constituted by a device as claimed in claim 1, comprising several thousand of said cells.

12. The device as claimed in claim 11, wherein the device comprises two rows of elementary cells made from coppered constantan separated by alternate layers of copper and constantan, the whole generating an electric current when the two above-mentioned rows have passing therethrought in series a heat flow.

13. A device sensitive to a heat flow or to a temperature gradient with at least one thermoelectric cell comprising essentially at least two continuous thin layers of a first conducting material having a face thereof coated with a thinner electrolytic deposit of a second conducting material different from said first conducting material and having thermoelectric properties different from the thermoelectric properties of said first conducting material, a heat conducting piece connecting said deposit of one of said two thin layers with said deposit on the other of said two thin layers, and at least a pair of layers of an insulating material disposed on opposite faces of said at least one thin layer and said deposit, the heat flow or temperature gradient being applied across a first one of said pair of layers, one of said thin layers, said deposit thereon, said heat conducting piece, said deposit on the other thin layer, said other thin layer and a second one of said pair of layers when said device is in operation, and said piece having a dissymmetrical shape or being displaced relative to the deposit on each one of said two thin layers.

* * * * *